US007896649B2

(12) United States Patent
Koyama et al.

(10) Patent No.: US 7,896,649 B2
(45) Date of Patent: Mar. 1, 2011

(54) HEAT SYSTEM, HEAT METHOD, AND PROGRAM

(75) Inventors: Noriaki Koyama, Oshu (JP); Wenling Wang, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 558 days.

(21) Appl. No.: 12/071,923

(22) Filed: Feb. 27, 2008

(65) Prior Publication Data
US 2008/0213716 A1  Sep. 4, 2008

(30) Foreign Application Priority Data
Mar. 1, 2007  (JP) ............... 2007-051494

(51) Int. Cl.
*G06F 19/00*  (2006.01)
*C23C 16/52*  (2006.01)
(52) U.S. Cl. .............. 432/247; 432/51; 427/8; 427/9; 700/121
(58) Field of Classification Search .......... 432/49, 432/51, 52, 53, 247; 427/8, 9; 700/121; 702/176; 118/665
See application file for complete search history.

(56) References Cited

U.S. PATENT DOCUMENTS

| 2002/0045146 A1* | 4/2002 | Wang et al. .............. 432/49 |
| 2007/0074660 A1* | 4/2007 | Park et al. .............. 118/715 |
| 2008/0213716 A1* | 9/2008 | Koyama et al. ............ 432/1 |
| 2008/0311297 A1* | 12/2008 | Hatano et al. .......... 427/255.28 |
| 2009/0117259 A1* | 5/2009 | Kataoka et al. .............. 427/9 |

FOREIGN PATENT DOCUMENTS

JP   2003-109906   4/2003

* cited by examiner

*Primary Examiner*—Gregory A Wilson
(74) *Attorney, Agent, or Firm*—Smith, Gambrell & Russell, LLP

(57) ABSTRACT

The present invention provides a heating system, a heating method and a program, which can readily control processing temperature. A temperature calculating computer 4 of the heating system includes a device DB 42. The device DB 42 stores therein a temperature correcting table indicative of a relationship between an accumulated film thickness of extraneous matter attached to the interior of each heating apparatus and a temperature correcting amount, with respect to each heating apparatus, for each temperature (processing temperature) in the heating apparatus. Thus, the temperature correcting amount can be specified based on the temperature correcting table, the processing temperature and the accumulated film thickness, so that an optimized value can be calculated from the specified temperature correcting amount.

16 Claims, 13 Drawing Sheets

| HEATING APPARATUS 2₁ | ZONE | PROCESSING TEMPERATURE 1 | ... | PROCESSING TEMPERATURE 10 |
|---|---|---|---|---|
| ACCUMULATED FILM THICKNESS 1 | ZONE 1 | +1°C | ... | +3°C |
| | ZONE 2 | +1°C | ... | +2.5°C |
| | ZONE 3 | +0.5°C | ... | +2°C |
| | ZONE 4 | 0°C | ... | +1.5°C |
| | ZONE 5 | 0°C | ... | +2°C |
| ⋮ | ⋮ | ⋮ | ⋮ | ⋮ |
| ACCUMULATED FILM THICKNESS 10 | ZONE 5 | +2°C | ... | +5°C |

(Similar tables for HEATING APPARATUS 2₂ ... HEATING APPARATUS 2n)

FIG. 7

| KINDS OF THE PROCESS | HEATING APPARATUS | ACCUMULATED FILM THICKNESS | PROCESSING TEMPERATURE | PRESET TEMPERATURE | | .... |
|---|---|---|---|---|---|---|
| SiN FILM FORMING | $2_1$ | 0 μm | 760°C | ZONE 1 | .... | .... |
| | | | | ZONE 2 | .... | .... |
| | | | | ZONE 3 | .... | .... |
| | | | | ZONE 4 | .... | .... |
| | | | | ZONE 5 | .... | .... |
| ⋮ | ⋮ | ⋮ | ⋮ | ⋮ | ⋮ | ⋮ |

| ACCUMULATED FILM THICKNESS | FILM THICKNESS (WAFER) | FILM THICKNESS CHANGE | TEMPERATURE CHANGE |
|---|---|---|---|
| 0 μm | 50nm | 0 | 0 |
| 1 μm | 49nm | −1 | −1 |
| ⋮ | ⋮ | ⋮ | ⋮ |
| 10 μm | 48nm | −2 | −2 |

HEAT SYSTEM, HEAT METHOD, AND PROGRAM

CROSS REFERENCE TO RELATED APPLICATIONS

This application is based on the prior Japanese Patent Application No. 2007-051494 filed on Mar. 1, 2007, the entire contents of which are incorporated herein by reference.

BACKGROUND OF THE INVENTION

1. Field of the Invention

The present invention relates to a heating system, a heating method and a program, each adapted for heating an object to be processed, such as a semiconductor wafer or wafers.

2. Background Art

In a process for manufacturing semiconductor devices, the heating system adapted for performing a film forming process for the object to be processed, such as the semiconductor wafer or wafers, is employed. In the heating system, various processing conditions, for example, a processing temperature, a processing pressure, a gas flow rate and the like, are determined, depending on, for example, a kind, film thickness and the like of a thin film to be formed, and a recipe, in which these processing conditions are described or fixed, is prepared for this system. For instance, by selecting such a recipe corresponding to the kind and film thickness of the thin film, a film-forming process and the like can be performed based on such predetermined processing conditions.

However, in the heating system, although it can provide an appropriate process at the start of operation, extraneous matter will be gradually attached and accumulated onto a wall of its furnace through a plurality of repetitions of the operation. With increase of film thickness of such accumulated extraneous matter, the temperature in the furnace will be lowered even though the operation is controlled under the same processing temperature. In such a manner, when the processing temperature for heating the semiconductor wafers is lowered and gets out of the processing conditions, uniformity between batches will be degraded, and/or it will be quite difficult to form a thin film of a desired film thickness onto each semiconductor wafer.

In a technique, for example, TOKUKAI No. 2003-109906, KOHO, which was proposed to address such a problem, a semiconductor manufacturing apparatus is described, which can enhance the uniformity between the batches by performing temperature control in accordance with a relationship between the accumulated film thickness and temperature required for forming the thin film.

Patent Document 1: TOKUKAI No. 2003-109906, KOHO

In TOKUKAI No. 2003-109906, KOHO, five zones are provided in the heating furnace in order to establish the relationship between the accumulated film thickness and the temperature to be corrected, such that, for example, when the accumulated film thickness becomes Aμm, the temperature is increased by B° C., thereby performing the temperature control for each zone in the furnace in accordance with this relationship. However, even with such temperature control, it is difficult to mechanically or automatically control the temperature in the furnace to a designated processing temperature, and thus an operator must perform the temperature control by experience and/or intuition. Therefore, a need still remains for the heating system and/or heating method, by which even an operator having no information and/or experience concerning the heating system and/or process can readily control the heating temperature.

The present invention was made in light of the above circumstances, and therefore it is an object of this invention to provide the heating system, the heating method and the program, which can control the processing temperature with ease, and which can provide an appropriate heating process to the objects to be processed.

SUMMARY OF THE INVENTION

In order to achieve the above object, the heating system according to the present invention comprises: a heating means having a processing chamber adapted for containing an object to be processed therein, the heating means being adapted for heating the object to be processed in the processing chamber; a heating condition storage means adapted for storing therein heating conditions including heating temperature in the processing chamber, corresponding to details of a heating process provided to the object to be processed; a heating control means adapted for controlling the heating means for heating the object to be processed in the processing chamber in accordance with the heating conditions stored in the heating condition storage means; a heating process number of times storage means adapted for storing therein the number of times of the heating process due to the heating means; a temperature correcting table storage means adapted for storing therein a temperature correcting table indicative of a relationship between the heating temperature, an accumulated film thickness of extraneous matter associated with the heating process and attached to the interior of the apparatus, and a temperature correcting value for correcting a temperature error in the processing chamber attributable to the attachment of the extraneous matter; and an optimized value calculating means adapted for specifying a current accumulated film thickness of the extraneous matter based on the heating process number of times storage means when the heating means heats the object to be processed in accordance with the heating conditions, as well as adapted for calculating an optimized value of the temperature in the processing chamber based on the specified accumulated film thickness, the heating temperature stored in the heating condition storage means, and the temperature correcting table stored in the temperature correcting table storage means, wherein the heating control means is configured to change the heating temperature stored in the heating condition storage means into the optimized value calculated by the optimized value calculating means, so as to heat the object to be processed at the changed heating temperature.

Alternatively, the heating system according to the present invention comprises: a heating means having a processing chamber adapted for containing an object to be processed therein, the heating means being adapted for heating the object to be processed in the processing chamber; a heating condition storage means adapted for storing therein heating conditions including heating temperature in the processing chamber, corresponding to details of a heating process provided to the object to be processed; a heating control means adapted for controlling the heating means for heating the object to be processed in the processing chamber in accordance with the heating conditions stored in the heating condition storage means; a heating process number of times storage means adapted for storing therein the number of times of the heating process due to the heating means; a model storage means adapted for storing therein a model indicative of a relationship between an accumulated film thickness of extraneous matter associated with the heating process and attached to the interior of the apparatus and a temperature change of the object to be processed; and an optimized value calculating means adapted for specifying a current accumulated film thickness of the extraneous matter based on the heating process number of times storage means when the heating means heats the object to be processed in accordance with the heating conditions, as well as adapted for calculating an optimized value of the temperature in the processing chamber based on the specified accumulated film thickness and the model stored in the model storage means, wherein the heating control means is configured to change the heating temperature stored in the heating condition storage means into the optimized value calculated by the optimized value calculating means, so as to heat the object to be processed at the changed heating temperature.

The model may be prepared, for example, for each heating condition corresponding to the details of the heating process provided to the object to be processed, and may be stored in the model storage means. Alternatively or additionally, the model may be prepared, for example, based on a result of the heating process due to the heating means, with the extraneous matter of the accumulated film thickness being attached to the interior of the apparatus.

The heating system may further comprises a temperature model information storage means adapted for storing therein temperature model information indicative of a relationship between a plurality of heating units for heating the processing chamber and a temperature of the object to be processed contained in the processing chamber while the processing chamber being heated by the plurality of heating units, wherein the heating control means may be adapted for controlling the heating units, so as to adjust the temperature of the object to be processed in the processing chamber at a temperature corresponding to the optimized value.

The processing chamber can be divided into a plurality of zones, wherein the plurality of heating units may be located corresponding to the respective zones. The optimized value calculating means may correct the model stored in the model storage means, after the model is prepared, based on the result of the heating process due to the heating means.

The heating control means may update the heating temperature stored in the heating condition storage means by the optimized value. The processing chamber can be divided into a plurality of zones, and the heating condition storage means may store therein the heating temperature for each zone.

The heating condition storage means may store therein the heating conditions in which calculation of the optimized value due to the optimized value calculating means is designated, wherein the optimized value calculating means may calculate the optimized value when the heating means heats the object to be processed in accordance with the heating conditions in which the calculation of the optimized value is designated. The optimized value calculating means may calculate the optimized value when the accumulated film thickness is greater than a predetermined thickness.

A plurality of heating apparatuses may be provided in the heating system, and the optimized value calculating means may be connected with the plurality of heating apparatuses via a communication means, wherein the optimized value calculating means may transmit the calculated optimized value to each corresponding heating apparatus via the communication means.

The heating method according to the present invention is a method for heating an object to be processed contained in a processing chamber by using a heating means, the method comprising: a heating condition storing step of storing heating conditions including heating temperature in the processing chamber, corresponding to details of a heating process provided to the object to be processed; a heating process controlling step of controlling the heating means for heating the object to be processed in the processing chamber in accordance with the heating conditions stored in the heating condition storing step; a heating process number of times storing step of storing the number of times of the heating process due to the heating means; a temperature correcting table storing step of storing a temperature correcting table indicative of a relationship between the heating temperature, an accumulated film thickness of extraneous matter associated with the heating process and attached to the interior of a heating apparatus, and a temperature correcting value for correcting a temperature error in the processing chamber attributable to the attachment of the extraneous matter; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness, the heating temperature stored in the heating condition storing step, and the temperature correcting table stored in the temperature correcting table storing step, wherein in the heating process controlling step, the heating temperature of the heating conditions is changed into the optimized value calculated in the optimized value calculating step, so as to heat the object to be processed at the changed heating temperature.

Alternatively, the heating method according to the present invention is a method for heating an object to be processed contained in a processing chamber by using a heating means, the method comprising: a heating condition storing step of storing heating conditions including heating temperature in the processing chamber, corresponding to details of a heating process provided to the object to be processed; a heating process controlling step of controlling the heating means for heating the object to be processed in the processing chamber in accordance with the heating conditions stored in the heating condition storing step; a heating process number of times storing step of storing the number of times of the heating process due to the heating means; a model storing step of storing a model indicative of a relationship between an accumulated film thickness of extraneous matter associated with the heating process and attached to the interior of a heating apparatus and a temperature change of the object to be processed; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness and the model stored in the model storing step, wherein in the heating process controlling step, the heating temperature of the heating conditions is changed into the optimized value calculated in the optimized value calculating step, so as to heat the object to be processed at the changed heating temperature.

The program according to the present invention is a computer program for use in a heating method for heating an object to be processed contained in a processing chamber by using a heating means, the computer program being designed to be operated in a computer, wherein the heating method comprises: a heating condition storing step of storing heating conditions including heating temperature in the processing chamber, corresponding to details of a heating process provided to the object to be processed; a heating process controlling step of controlling the heating means for heating the object to be processed in the processing chamber in accordance with the heating conditions stored in the heating condition storing step; a heating process number of times storing step of storing the number of times of the heating process due to the heating means; a temperature correcting table storing step of storing a temperature correcting table indicative of a relationship between the heating temperature, an accumulated film thickness of extraneous matter associated with the heating process and attached to the interior of a heating apparatus, and a temperature correcting value for correcting a temperature error in the processing chamber attributable to the attachment of the extraneous matter; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness, the heating temperature stored in the heating condition storing step, and the temperature correcting table stored in the temperature correcting table storing step, wherein in the heating process controlling step, the heating temperature of the heating conditions is changed into the optimized value calculated in the optimized value calculating step, so as to heat the object to be processed at the changed heating temperature.

Alternatively, the program according to the present invention is a computer program for use in a heating method for heating an object to be processed contained in a processing chamber by using a heating means, the computer program being designed to be operated in a computer, wherein the heating method comprises: a heating condition storing step of storing heating conditions including heating temperature in the processing chamber, corresponding to details of a heating process provided to the object to be processed; a heating process controlling step of controlling the heating means for heating the object to be processed in the processing chamber in accordance with the heating conditions stored in the heating condition storing step; a heating process number of times storing step of storing the number of times of the heating process due to the heating means; a model storing step of storing a model indicative of a relationship between an accumulated film thickness of extraneous matter associated with the heating process and attached to the interior of a heating apparatus and a temperature change of the object to be processed; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness and the model stored in the model storing step, wherein in the heating process controlling step, the heating temperature of the heating conditions is changed into the optimized value calculated in the optimized value calculating step, so as to heat the object to be processed at the changed heating temperature.

According to the present invention, the heating system, the heating method and the program, which can readily control the processing temperature, can be provided.

BRIEF DESCRIPTION OF THE DRAWINGS

FIG. 7 is a diagram showing one example of a temperature correcting table.

DETAILED DESCRIPTION OF THE INVENTION

EXAMPLES

First Embodiment

Hereinafter, the heating system, the heating method and the program, according to this invention, will be described.

Figure 1:
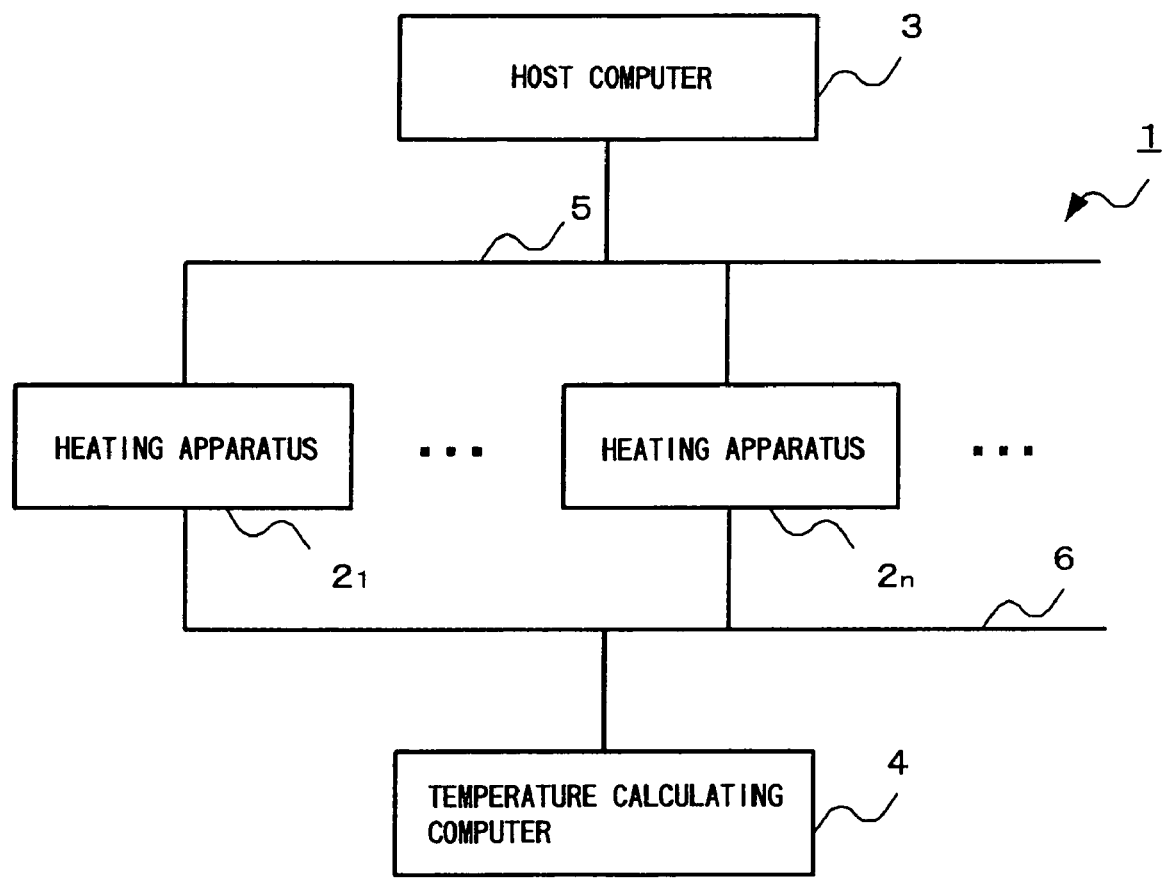
FIG. 1 is a diagram showing construction of a heating system related to a first embodiment of the present invention.

As shown in FIG. 1, the heating system 1 of this embodiment includes a plurality of heating apparatuses 2 ($2_1$ to $2_n$: heating means), a host computer 3, a temperature calculating computer 4, and networks 5, 6 for connecting these components relative to one another. In addition, the heating system 1 may includes measuring devices for measuring film thickness, density and the like, of a thin film formed on an object or objects to be processed due to the heating apparatuses 2.

Figure 2:
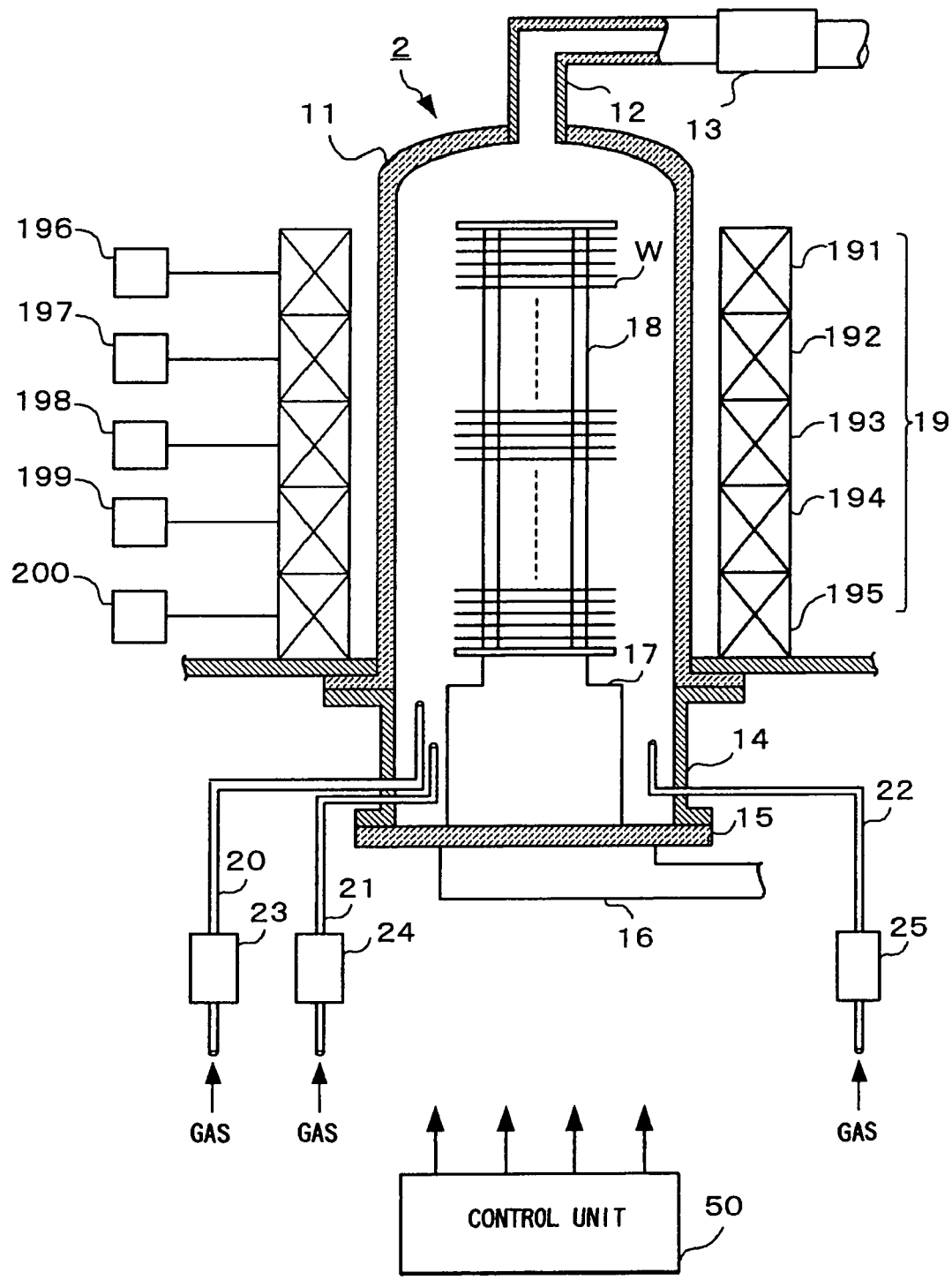
FIG. 2 is a diagram showing a structure of the heating apparatus shown in FIG. 1.

As the heating apparatuses 2 of this invention, various kinds of heating apparatuses are known, and, for example, a film forming apparatus adapted for providing a film forming process to the objects to be processed, an oxidation apparatus adapted for performing an oxidizing process for oxidizing a surface region of each object to be processed, and a diffusion apparatus adapted for diffusing (or doping) impurities into a surface region of each object to be processed can be mentioned. Hereinafter, as one example of the heating apparatuses 2, a batch-type vertical heating apparatus as shown in FIG. 2 will be described by way of example. It is noted that, in this embodiment, the present invention will be described, with respect to the film forming process, by way of example, as the process provided to the objects.

As shown in FIG. 2, each heating apparatus 2 includes a generally cylindrical reaction vessel (or processing chamber) 11. The reaction vessel 11 is oriented such that its longitudinal direction is vertically directed. The reaction vessel 11 is formed from a material excellent in heat resistance and corrosion resistance, for example, quartz.

From above the reaction vessel 11, an exhaust pipe 12 adapted for discharging gases from the reaction vessel 11 is airtightly connected thereto. A pressure control unit 13 composed of a valve, a vacuum pump and the like, is provided to the exhaust pipe 12, and serves to control pressure (or degree of vacuum) in the reaction vessel 11 to a desired level.

Under the reaction vessel 11, a substantially cylindrical manifold 14 is provided. The manifold 14 is airtightly joined, at its top end, to a bottom end of the reaction vessel 11.

A cover 15 is located below the manifold 14 (or reaction vessel 11). The cover 15 is configured to be optionally moved in the vertical direction due to actuation of a boat elevator 16. With such configuration, when the cover 15 is elevated by the boat elevator 16, a bottom end opening (or furnace port) of the manifold 14 (or reaction vessel 11) will be closed, while when the cover 15 is lowered by the boat elevator 16, the bottom end opening (or furnace port) of the reaction vessel 11 will be opened.

A wafer boat 18 is provided on the cover 15 via a heat insulating mould (or heat insulating member) 17. The wafer boat 18 serves as a wafer holding tool adapted for receive (or hold) the objects to be processed, for example, semiconductor wafers W, therein. In this embodiment, the wafer boat 18 is configured to contain therein multiple sheets of, for example, 150 sheets of, semiconductor wafers W, in the vertical direction, with a predetermined gap. Thus, the semiconductor wafers W are contained in the wafer boat 18, and the cover 15 is then lifted up by the boat elevator 16, so that the semiconductor wafers W can be loaded in the reaction vessel 11.

Around the reaction vessel 11, a heater unit 19 composed of, for example, resistance heating members, is provided to surround the reaction vessel 11. Due to this heater unit 19, the interior of the reaction vessel 11 can be heated up to a predetermined temperature, as such the semiconductor wafers W can also be heated to the predetermined temperature.

Figure 3:
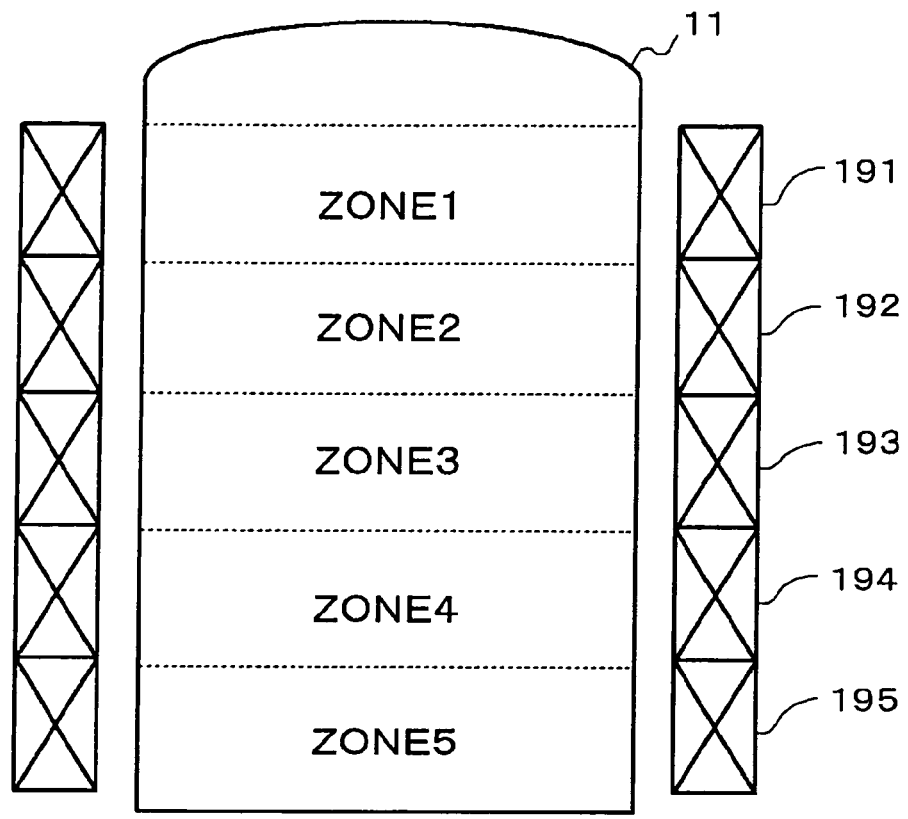
FIG. 3 is a diagram showing heating zones in a reaction vessel.

The heater unit 19 includes heaters 191 to 195 arranged in, for example, five stages, wherein each heater 191 to 195 is independently supplied with electric power and thus independently controlled, by each corresponding power controller 196 to 200. In this manner, the interior of the reaction vessel 11 is divided into five zones (ZONES 1 to 5) by the heaters 191 to 195, as shown in FIG. 3.

To the manifold 14, a plurality of gas supply pipes, each adapted for supplying a gas into the reaction vessel 11, are provided. In this embodiment, three gas supply pipes 20 to 22 are provided. To the respective gas supply pipes 20 to 22, a raw material gas or gasses used for the film forming and a carrier gas are supplied, via flow rate control units 23 to 25 each composed of a mass flow controller (MFC) or the like for controlling each gas flow rate.

To an inner wall of the reaction vessel 11, five temperature sensors (thermocouples) (not shown) are arranged, in a line, in the vertical direction. Each of the temperature sensors is covered with a quartz pipe or the like in order to prevent metal contamination of the semiconductor wafers W, and is arranged in each zone shown in FIG. 3.

Figure 4:
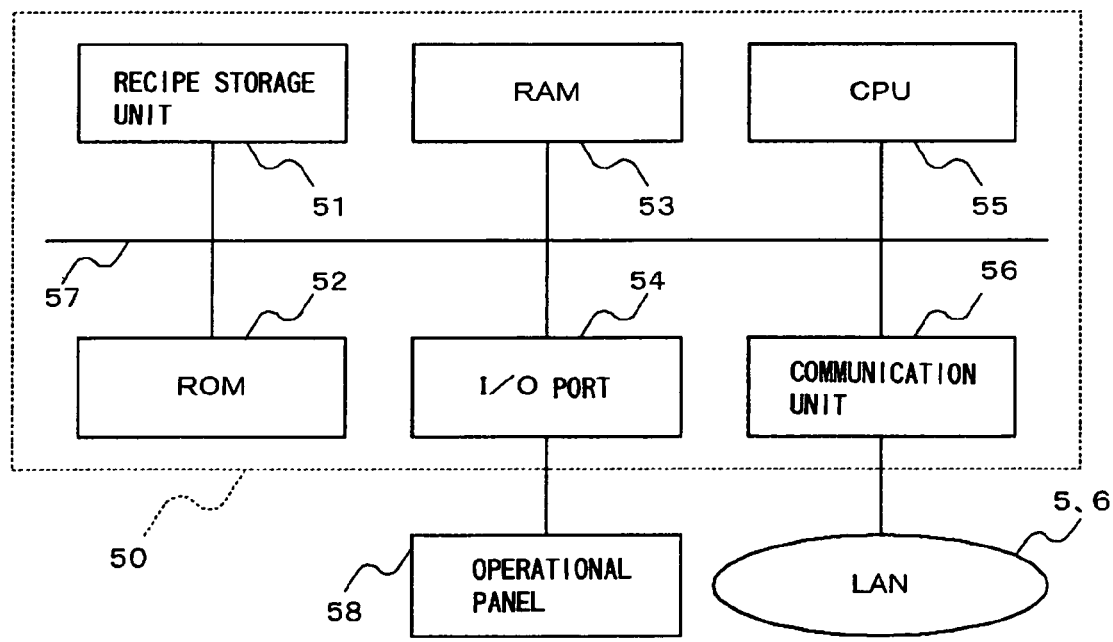
FIG. 4 is a block diagram showing one example of construction of a control unit shown in FIG. 2.

Each heating apparatus 2 includes a control unit 50 for controlling processing parameters, such as temperature, gas flow rates, pressure and the like, of a processing atmosphere in the reaction vessel 11. The control unit 50 receives output signals from the temperature sensors, pressure sensors and the like (not shown) and outputs control signals to the power controllers 196 to 200 for the heaters 191 to 195, pressure control unit 13 and flow rate control units 23 to 25, respectively. FIG. 4 shows construction of the controller 50.

As shown in FIG. 4, the control unit 50 includes a recipe storage unit 51, a ROM 52, a RAM 53, an I/O port 54, a CPU 55, a communication unit 56 and a bus 57 for connecting these units relative to one another.

In the recipe storage unit 51 (or heating condition storage means), processing recipes (or heating conditions) defining each controlling procedure are stored, corresponding to kinds of film forming processes performed by the heating apparatus. Each processing recipe is prepared for each process actually performed by an operator, and prescribes therein temperature change of each part, pressure change in the reaction vessel 11, timing of start and stop of supply of each gas, a supply amount of each gas and the like, during a period of time from loading the semiconductor wafers W into the reaction vessel 11 to unloading the processed semiconductor wafers W. With such a recipe, a preset film thickness due to a certain heating process and/or preset temperature of each part can be specified. In the case of a usual batch-type heating apparatus, a single temperature recipe is prepared for all of the semiconductor wafers W. In this embodiment, however, a predetermined temperature recipe is provided for each zone shown in FIG. 3, in order to obtain a more uniform result of the process provided to the semiconductor wafers W.

In the processing recipes, an optimized value calculating recipe (or heating conditions in which calculation of an optimized value due to an optimized value calculating means is designated) is included. The optimized value calculating recipe is set or provided to calculate an optimum temperature (or optimized value) in the heating method described later, with respect to the preset temperature for each part of the apparatus, so as to determine the calculated value as the preset temperature. Thus, in the case of performing the heating process based on the optimized value calculating recipe, in the heating method described below, the optimized value of the preset temperature of each part of the apparatus is calculated, so as to set the calculated optimized value as the preset temperature.

The ROM 52 is composed of, an EEPROM, a flash memory, a hard disk or the like, and serves as a storage medium for storing operational programs of the CPU 55 and the like therein. The RAM 53 functions as a working area for the CPU 55. For example, in the RAM 53 (or heating process number of times storage means), the number of times of the process performed by each heating apparatus is stored. With the number of times of the process and the preset film thickness stored in the recipe storage unit 51, the accumulated film thickness of the extraneous matter attached to the interior of each heating apparatus 2 can be specified.

The I/O port 54 supplies measured signals related to the temperature, pressure and gas flow rates to the CPU 55 and outputs control signals outputted from the CPU 55 to the respective units (e.g., the power controllers 196 to 200, flow rate control units 23 to 25 and pressure control unit 13). An operation panel 58, by which the operator can operate each heating apparatus 2, is connected with the I/O port 54.

The CPU (Central Processing Unit) (or heating control means) 55 constitutes a main part of the control unit 50, and is configured to execute the operational program stored in the ROM 52, so as to control the operation of each heating apparatus 2, in accordance with the processing recipes stored in the recipe storage unit 51, based on an instruction from the operational panel 58.

The communication unit 56 is configured to perform communication between each heating apparatus 2, the host computer 3 and the temperature calculating computer 4, via the LANs 5, 6 (communication means). The bus 57 transmits information between the respective units.

Figure 5:
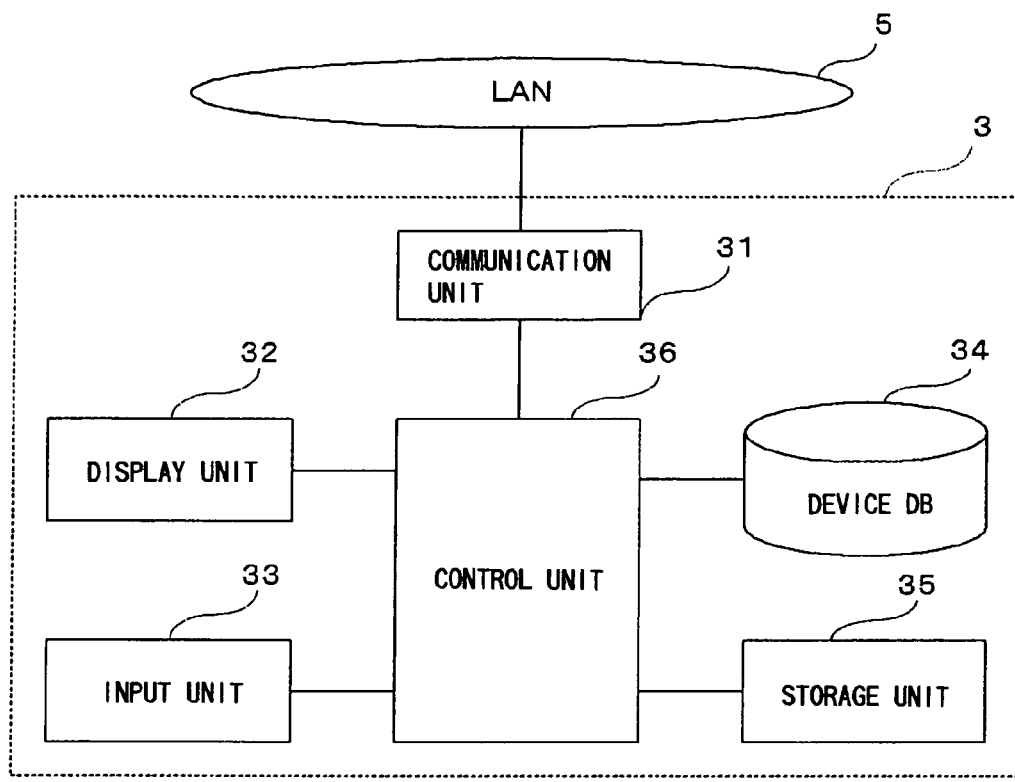
FIG. 5 is a diagram showing construction of a host computer shown in FIG. 1.

The host computer 3 is a device adapted for controlling the entire system of the heating apparatuses $2_1$ to $2_n$, and performs a process for directing each heating apparatus $2_1$ to $2_n$ to execute the heating process. FIG. 5 shows one example of construction of the host computer 3.

As shown in FIG. 5, the host computer 3 includes a communication unit 31, a display unit 32, an input unit 33, a device data base (DB) 34, a storage unit 35, and a control unit 36.

The communication unit 31 performs communication between the heating apparatuses $2_1$ to $2_n$ via the LAN 5. The display unit 32 provides a variety of information of the host computer 3 to the operator. The input unit 33 inputs instructions and data of the operator to the control unit 36.

The device DB 34 is composed of a hard disk device or the like, and is configured to store therein a control table in which data necessary for controlling the respective apparatuses are entered, for each kind of the processing apparatuses, with respect to the heating apparatuses $2_1$ to $2_n$. In the control table, for example, device ID, the recipe and the like are stored, for each heating apparatus 2 connected to this system. The device ID is identification information for each heating apparatus 2 connected with this system, and the recipe is one currently stored in the heating apparatus 2.

The storage unit 35 stores therein an operational program or the like of the control unit 36, and functions as a working area for the control unit 36. The control unit 36 is operated in accordance with the control program stored in the storage unit 35, so as to control the entire system of the host computer 3.

Figure 6:
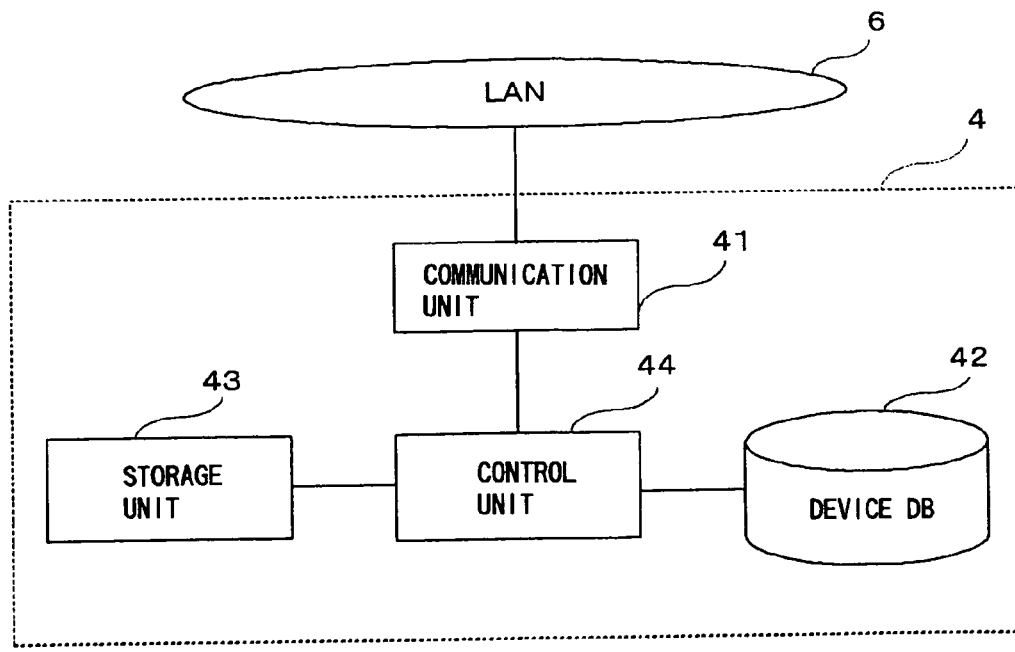
FIG. 6 is a diagram showing construction of a temperature calculating computer shown in FIG. 1.

The temperature calculating computer 4 performs a process for calculating the processing temperature, such that an appropriate process can be carried out, by each heating apparatus $2_1$ to $2_n$, for each predetermined accumulated film thickness (or each number of times of the process). FIG. 6 shows one example of construction of the temperature calculating computer 4.

As shown in FIG. 6, the temperature calculating computer 4 includes a communication unit 41, a device data base (DB) 42, a storage unit 43, and a control unit 44.

The communication unit 41 performs communication between the respective heating apparatuses $2_1$ to $2_n$ via the LAN 6.

The device DB (or temperature correcting table storage means) 42 is composed of a hard disk device or the like, and configured to store therein a temperature correcting table indicative of a relationship between the accumulated film thickness of the extraneous matter attached to the interior of the apparatus and a temperature correcting amount, for each temperature (or processing temperature) in the corresponding heating apparatus 2, with respect to each heating apparatus $2_1$ to $2_n$. In the temperature correcting table, for example, as shown in FIG. 7, the temperature correcting amount, in the case in which the temperature in each heating apparatus 2 is set at a predetermined temperature and in which the extraneous matter of a predetermined accumulated film thickness is attached to the interior of the apparatus, is fixed for each zone.

It is noted that when the processing temperature and/or accumulated film thickness is different from each value fixed in the temperature correcting table, a proper adjustment will be given by interpolation.

The storage unit 43 stores therein an operational program or the like of the control unit 44, and functions as a working area for the control unit 44. The control unit 44 is operated in accordance with the control program stored in the storage unit 43. Additionally, the control unit 44 (or optimized value calculating means) performs an optimized value calculating process, as will be described below, for calculating an optimized processing temperature, such that an appropriate process can be performed corresponding to the number of times of the process of each heating apparatus $2_1$ to $2_n$.

The networks 5, 6 transmit information between the respective units, respectively.

Figure 8:
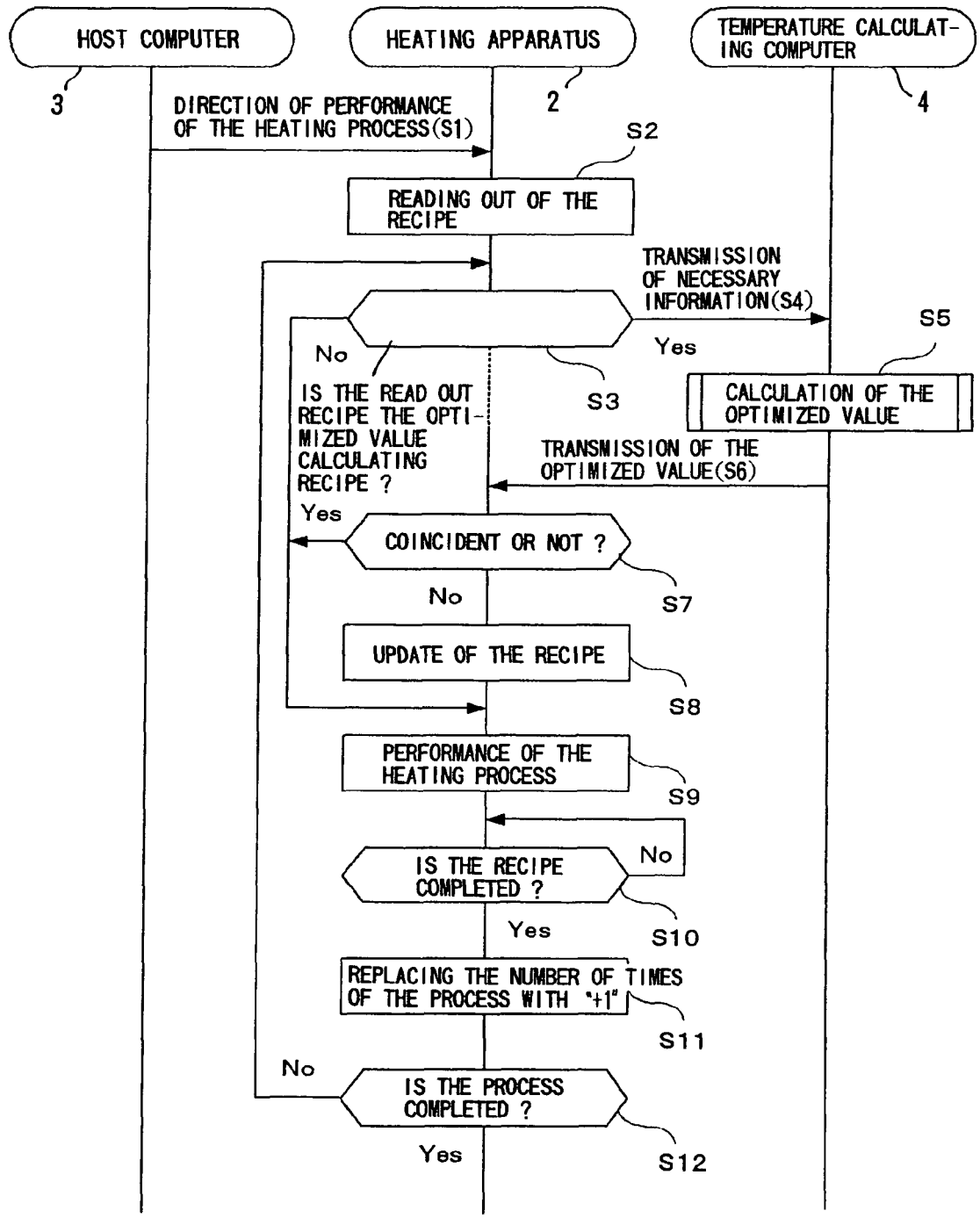
FIG. 8 is a diagram for illustrating a heating method.

Next, a heating method, employing the heating system 1 constructed as described above, will be discussed, with reference to FIG. 8.

First, when the operator of the heating system 1 operates the input unit 33 of the host computer 3 so as to designate details of a process (e.g., such that the operator can perform a film forming process X times for forming an oxidized film of a Y-nm thickness on each semiconductor wafer W) and the heating apparatus 2 that performs the process, the control unit 36 of the host computer 3 will transmit information on performing the designated heating process to the designated heating apparatus 2, and direct it to perform the heating process (step S1).

The CPU 55 of the directed heating apparatus 2 that received the information on performing the heating apparatus then reads out the recipe used for the designated heating process, from the processing recipes stored in the recipe storage unit 51, based on the received details (step S2). Thereafter, the CPU 55 discriminates whether or not the read out recipe is the optimized value calculating recipe (step S3). If the read out recipe is not the optimized calculating recipe (i.e., "No" in the step S3), the CPU 55 will go to a step S9.

Contrary, if the read out recipe is the optimized calculating recipe (i.e., "Yes" in the step S3), the CPU 55 will transmit information described in the recipe, i.e., information necessary for calculating the optimized value, such as a current accumulated film thickness and the like, to the temperature calculating computer 4, so as to direct the temperature calculating computer 4 to calculate the optimized value (step S4).

Figure 9:
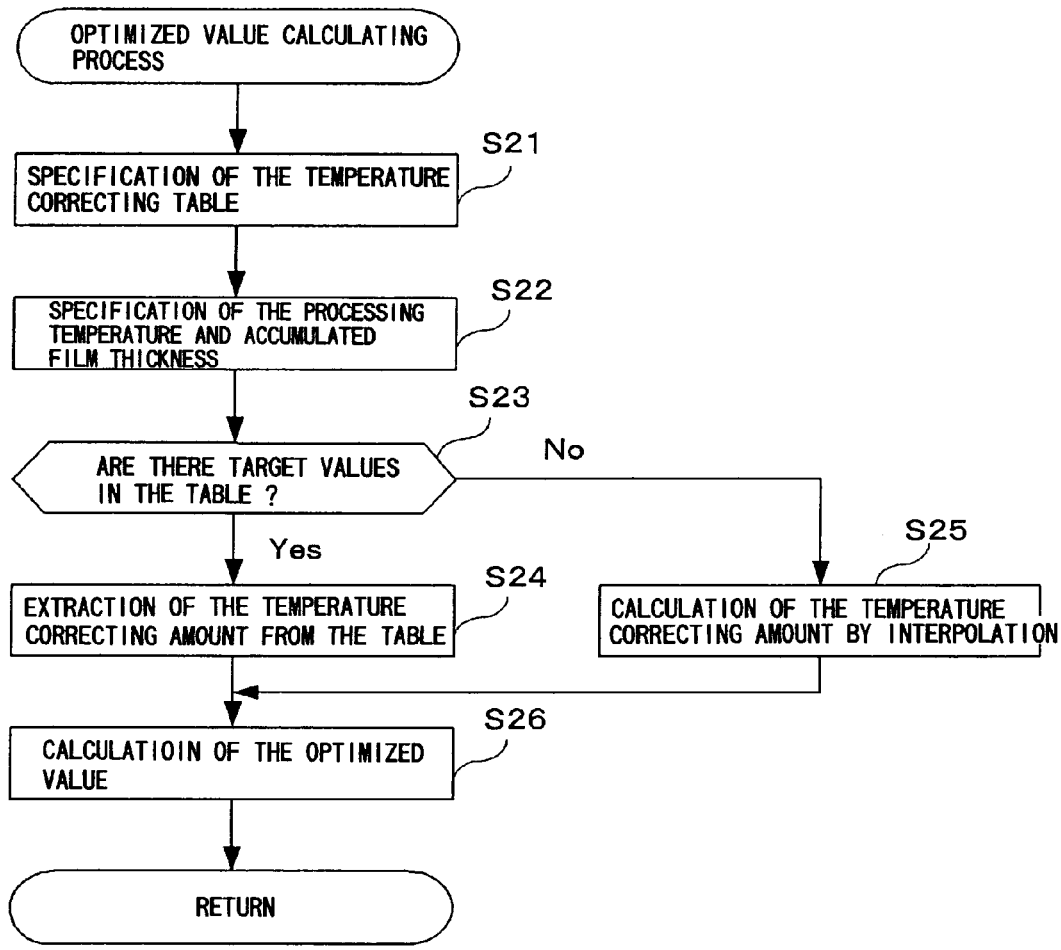
FIG. 9 is a flow chart for illustrating an optimized value calculating process shown in FIG. 8.

When receiving the information necessary for calculating the optimized value, the control unit 44 of the temperature calculating computer 4 will perform the optimized value calculating process for calculating the optimized value, for each zone, based on the received information and the temperature correcting table (step S5). FIG. 9 is a flow chart for illustrating the optimized value calculating process.

First, the control unit 44 specifies the temperature correcting table based on the transmitted information on the heating apparatus 2 (step S21). Then, the control unit 44 specifies the temperature (or processing temperature) and accumulated film thickness in the heating apparatus 2 from the received information (step S22). Subsequently, the control unit 44 discriminates whether or not the specified processing temperature and accumulated film thickness are present as the processing temperature and accumulated film thickness, for each zone, in the specified temperature correcting table (step S23). If these values are found in the temperature correcting table (i.e., "Yes" in the step S23), the control unit 44 will extract the temperature correcting amount from the temperature correcting table (step S24). If these values are not seen in the temperature correcting table (i.e., "NO" in the step S23), the control unit 44 will figure out the temperature correcting amount by interpolation using a plurality of values around these values (step S25). Thereafter, the control unit 44 adds the temperature correcting value to an initial temperature specified from the information described in the received recipe, so as to calculate the optimized value for each zone (step S26). After this calculation, this process will be ended.

Once obtaining the optimized value of each zone 1 to 5, the control unit 44 transmits information concerning the obtained optimized value of each zone 1 to 5 to the heating apparatus 2 (step S6).

The CPU 55 of the heating apparatus 2 discriminates whether or not each received optimized value is coincident with a current value (or an initial value of the first time) (step S7). When both values are coincident with each other (i.e., "Yes" in the step S7), the CPU 55 will go to the step S9. Contrary, when both values are not coincident (i.e., "No" in the step S7), the CPU 55 (or heating control means) will change the current value into the received optimized value, so as to update the recipe (step S8).

Then, the CPU 55 performs the heating process (or film forming process) in accordance with the recipe. Specifically, the CPU 55 places the semiconductor wafers W into the wafer boat 18, and elevates the cover 15 by using the boat elevator 16, so as to load the semiconductor wafers W into the heating apparatus 2 (or reaction vessel 11). The CPU 55 controls the power controllers 196 to 200 such that each zone 1 to 5 of the heating apparatus 2 is adjusted at each temperature fixed in the recipe. Additionally, the CPU 55 controls the flow rate control units 23 to 25 and pressure control unit 13, such that the flow rate of each processing gas supplied into the heating apparatus 2 and the pressure in the heating apparatus 2 will be the flow rate and pressure fixed in the processing recipe, respectively. Thereafter, once a thin film having a predetermined thickness is formed on each semiconductor wafer W, the CPU 55 lowers the cover 15 by using the boat elevator 16, so as to unload the semiconductor wafers W from the heating apparatus 2.

Subsequently, the CPU 55 discriminates whether or not the process (or recipe) for one time has been completed (step S10). If judging that the recipe was completed (i.e., "Yes" in the step S10), the CPU 55 will replace the number of times of the process, stored in the RAM 53, with "+1" (step S11). Then, the CPU 55 discriminates whether or not the number of times of the process, fixed in the information on performing the heating process received from the host computer 3, has been achieved (step S12). If the fixed number of times of the process was not achieved (i.e., "No" in the step S12), the CPU 55 will return to the step S3, and perform the heating process. Contrary, if the fixed number of times of the process was completed (i.e., "Yes" in the step S12), the CPU 55 will stop the process.

As described above, according to this embodiment, since the optimized value is calculated by using the temperature correcting table and the heating process is performed based on the calculated optimized value, the heating temperature can be readily controlled even by such an operator having no information and/or experience concerning the heating system and/or process.

Additionally, according to this embodiment, since the optimized value is calculated by using the temperature calculating computer 4, the processing temperature can be readily controlled without making software construction and/or hardware construction of each heating apparatus 2 so complicated.

Second Embodiment

In the first embodiment, the present invention has been described by way of example, in regard to the case in which the optimized value is calculated by using the temperature correcting table. In the second embodiment, however, the present invention will be described by way of example, in regard to the case in which a model indicative of a relationship between the accumulated film thickness and the temperature change of the semiconductor wafers W is first prepared and corrected, and the optimized value is then calculated by using this model.

Thus, in the second embodiment, the construction of the temperature calculating computer is different from that of the temperature calculating computer 4 of the first embodiment. Hereinafter, description centered on such a different point from the first embodiment will be provided.

Figures 10, 11:
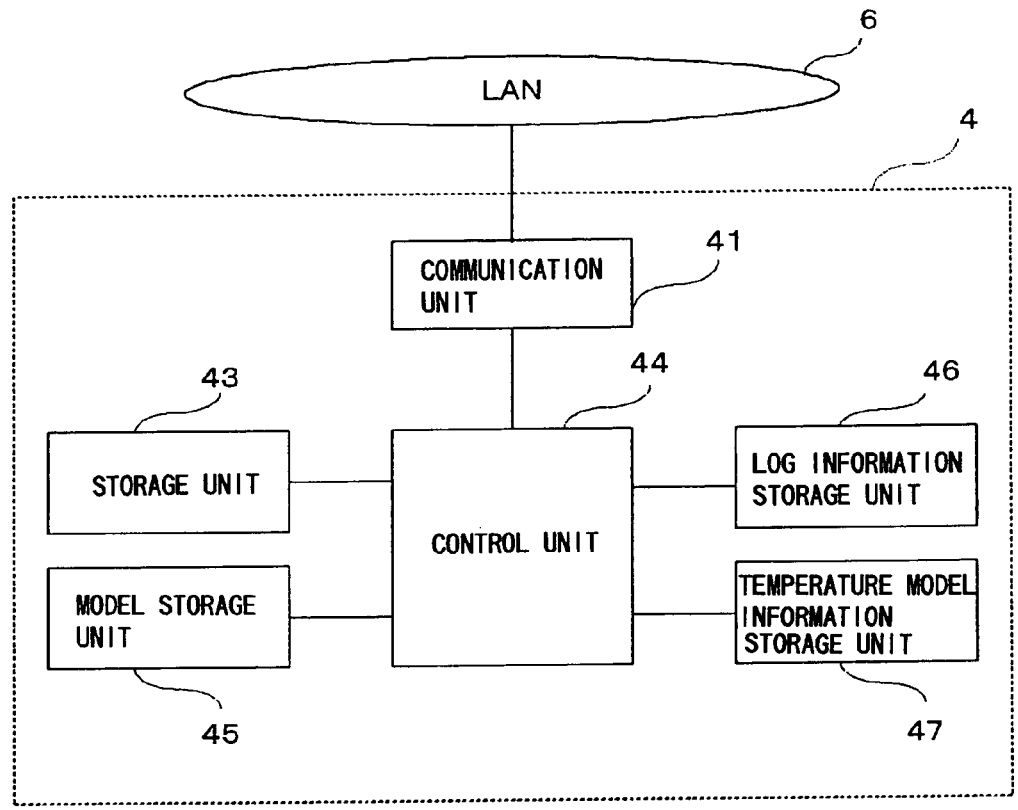
FIG. 10 is a diagram showing construction of the temperature calculating computer of a second embodiment.
FIG. 11 is a diagram showing one example of a log information storage unit shown in FIG. 10.

As shown in FIG. 10, the temperature calculating computer 4 of this embodiment includes the communication unit 41, the storage unit 43, the control unit 44, a model storage unit 45, a log information storage unit 46, and a temperature model information storage unit 47.

The communication unit 41, as with the first embodiment, performs communication between the respective heating apparatuses $2_1$ to $2_n$ via the LAN 6. The storage unit 43, as with the first embodiment, stores therein an operational program of the control unit 44, and functions as a working area for the control unit 44.

The model storage unit (or model storage means) 45 stores therein the model indicative of the relationship between the accumulated film thickness of extraneous matter attached to the interior of the apparatus and the temperature change of the semiconductor wafers W. Namely, in the model storage unit 45, a plurality of models, prepared for each kind of the heating process, are stored, with respect to each heating apparatus $2_1$ to $2_n$. Each model is prepared based on log information stored in the log information storage unit 46. The preparation and correction for each model will be described later.

In the log information storage unit 46, the log information concerning the heating conditions performed in the past and their results is stored. In the log information storage unit 46, for example, as shown in FIG. 11, the kinds of the heating process, heating apparatuses used for the process, accumulated film thicknesses, processing temperatures, preset temperatures for the respective zones, film thicknesses formed on the semiconductor wafers W and the like, are stored.

The temperature model information storage unit (or temperature model information storage means) 47 stores therein information concerning the relationship between the temperature change of each heater (or heating unit) 191 to 195 of each heating apparatus 2 and the temperature change of the semiconductor wafers W contained in each zone. For instance, such a relationship that, if the preset temperature of the heater 191 is increased by 1° C., the temperature of the semiconductor wafers W contained in the zone 1 will be increased by xx° C., while the temperature of the semiconductor wafers W contained in the zone 2 will be increased by yy° C., or the like, is stored.

The control unit 44 is operated in accordance with the control program stored in the storage unit 43. Additionally, the control unit 44 performs the optimized value calculating process or the like, as will be described below, for calculating the optimized processing temperature, such that an appropriate process can be performed, corresponding to the number of times of the process, for each heating apparatus $2_1$ to $2_n$.

Figure 12:
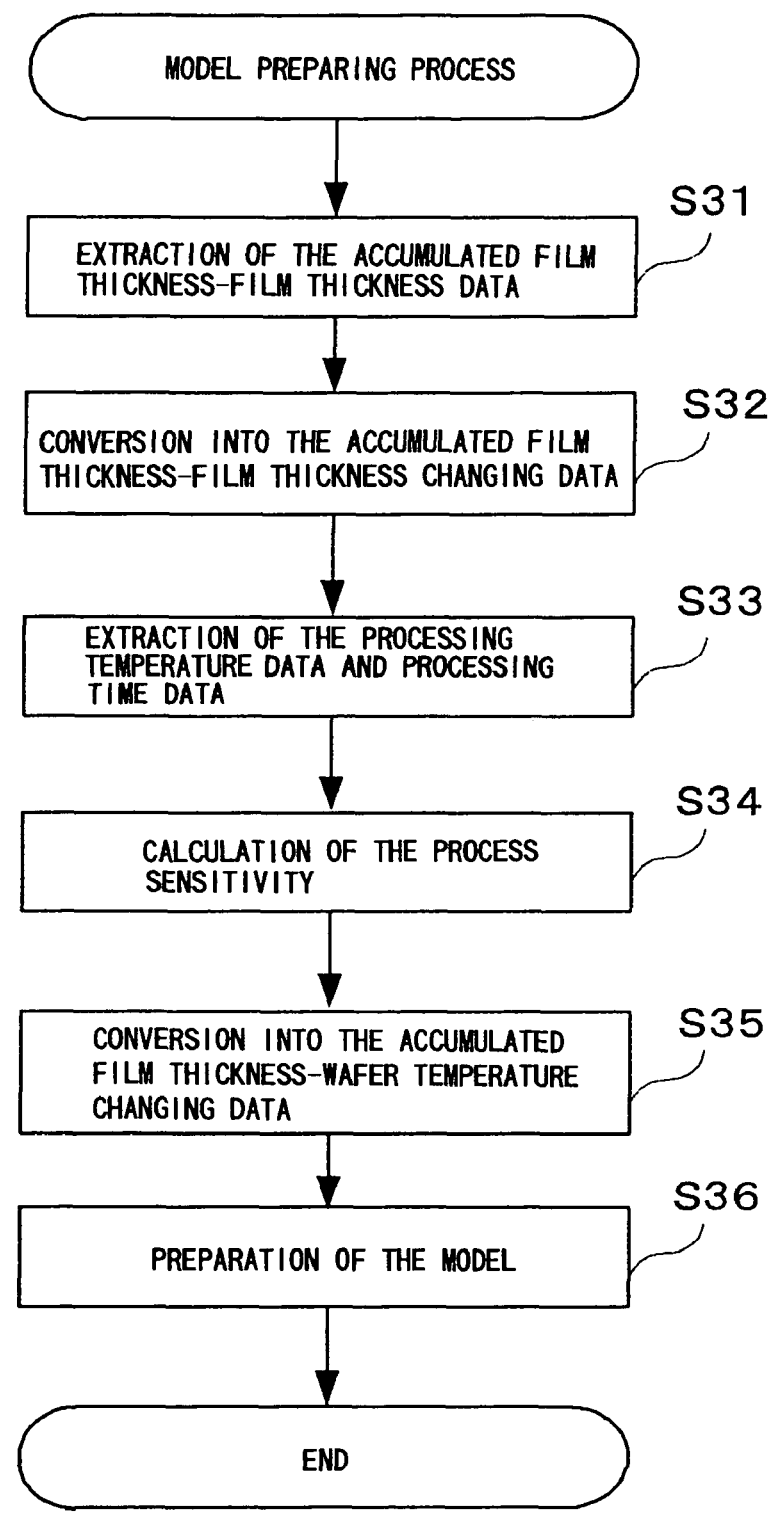
FIG. 12 is a flow chart for illustrating a model preparing process.

Next, a model preparing method (or process) stored in the model storage unit 45 will be discussed. In this embodiment, the model preparing process for use in forming a SiN film using the heating apparatus $2_1$ is described by way of example. FIG. 12 is a flow chart for illustrating the model preparing process.

Figure 13:
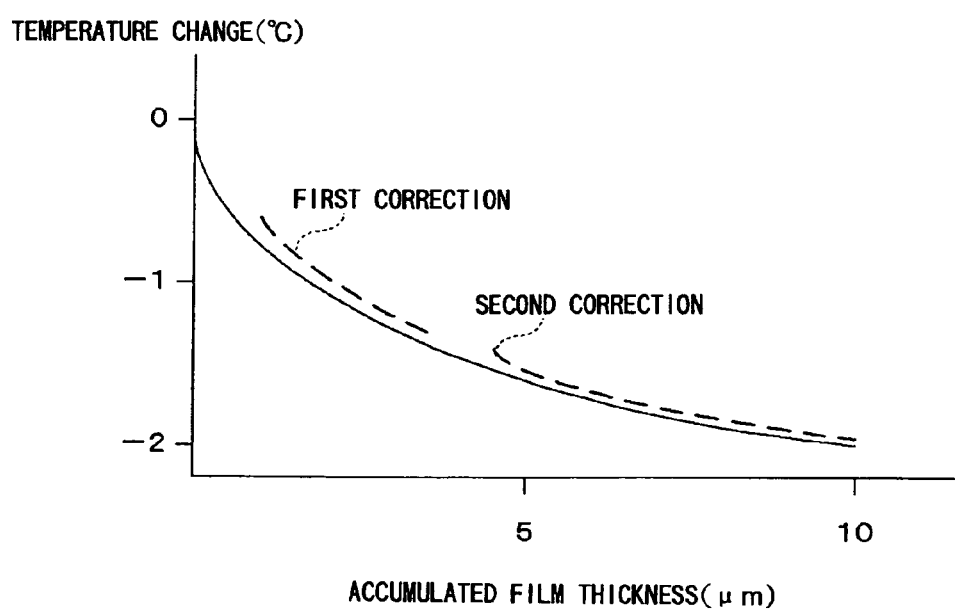
FIGS. 13A and 13B are diagrams for respectively illustrating the model preparing process.

First, the control unit 44 of the temperature calculating computer 4 extracts accumulated film thickness data and film thickness data of a film formed on each semiconductor wafer W, in a film forming process of the SiN film by using the heating apparatus $2_1$, in a one-to-one correspondence, as shown in FIG. 13A, from the log information stored in the log information storage unit 46 (step S31). Subsequently, the control unit 44 converts the accumulated film thickness data and film thickness data (or accumulated film thickness data-film thickness data) extracted in one-to-one correspondence into accumulated film thickness data-film thickness changing data, as shown by change in the film thickness in FIG. 13B (step S32).

Thereafter, the control unit 44 extracts processing temperature data and processing time data for forming the SiN film from the log information stored in the log information storage unit 46 (step S33). Then, the control unit 44 obtains activation energy from the extracted processing temperature data and processing time data, and calculates process sensitivity (step S34). It is noted that the processing temperature may be specified in advance for each film to be formed and/or each kind of the processing gas.

What is meant by the "process sensitivity" is the change in the film thickness when the temperature of the semiconductor wafers W is shifted by 1° C., and can be expressed by the following equation.

Process sensitivity (%)=$(Ea)/(K \times T^2)$

In this equation, Ea is the activation energy, and is defined by the temperature and time of the heating process. K is the Boltzmann constant ($1.38049 \times 10^{-23}$ (J/mole·K)), and T is the absolute temperature.

Thereafter, the control unit 44 converts the accumulated film thickness data-film thickness changing data into accumulated film thickness data-wafer temperature changing data, by using the calculated process sensitivity (step S35). For instance, as with the temperature change shown in FIG. 13A, in the wafer temperature change in the film forming process of the SiN film of this embodiment, the film thickness will be thinned by 1 nm as the wafer temperature is decreased by 1° C.

Subsequently, the control unit 44 prepares the model indicative of the relationship of the accumulated film thickness-wafer temperature change, as shown in FIG. 13B, by using a predetermined approximating method, for example, the least squares method (step S36), and then stops this process.

Figure 14:
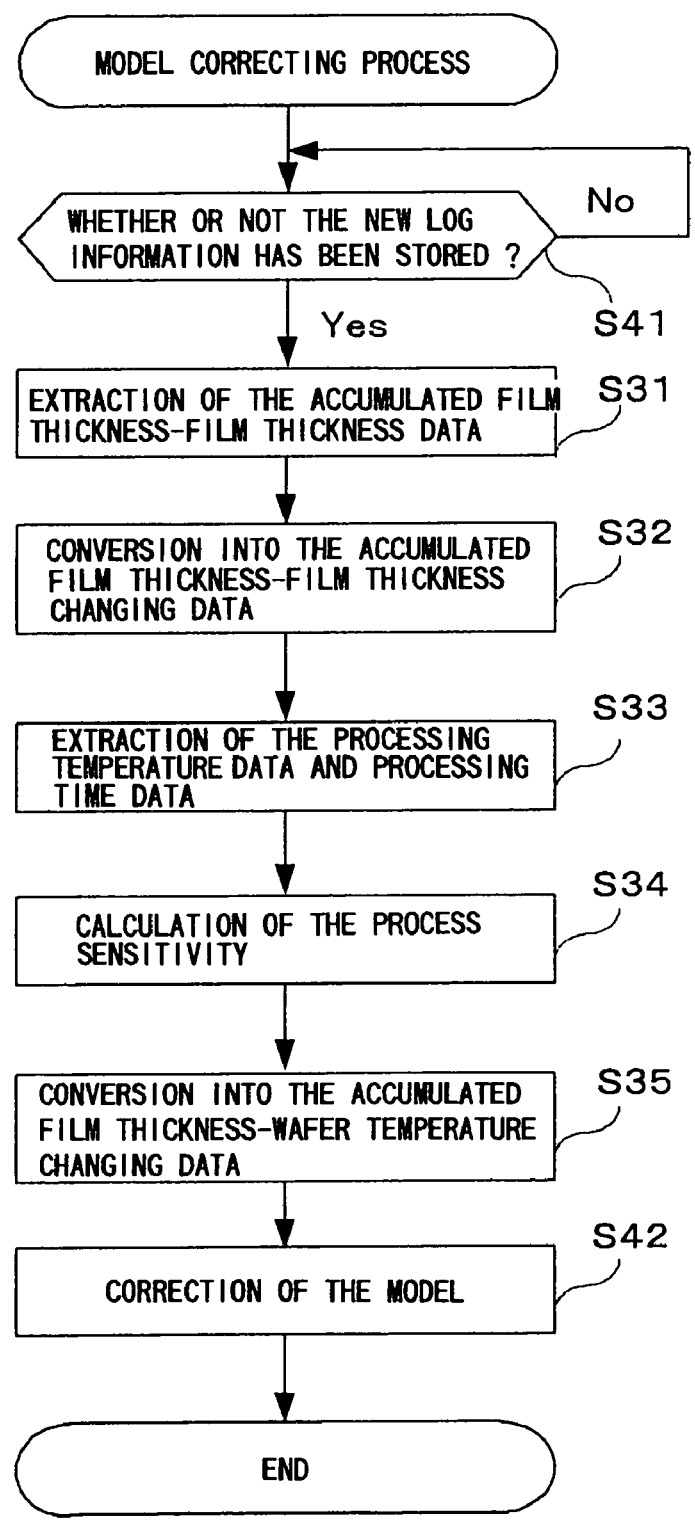
FIG. 14 is a flow chart for illustrating a model correcting process.

Next, a model correcting method (or process) for the model stored in the model storage unit 45 will be described. This model correcting process is a process for correcting the corresponding model stored in the model storage unit 45 in the case in which a new heating process is performed and new log information on this heating process is stored in the log information storage unit 46. FIG. 14 is a flow chart for illustrating this model correcting process.

The control unit 44 discriminates whether or not the new log information has been stored in the log information storage unit 46 (step S41). If the new log information has been stored in the log information storage unit (i.e., "Yes" in the step S41), the control unit 44 performs the processes from the step S31 to step S35 of the aforementioned model preparing process. Thereafter, the control unit 44 calculates the correcting amount for a necessary wafer temperature from the accumulated film thickness and the model, and corrects the model as shown by each dotted line in FIG. 13B (step S42), and then stops this process.

Figure 15:
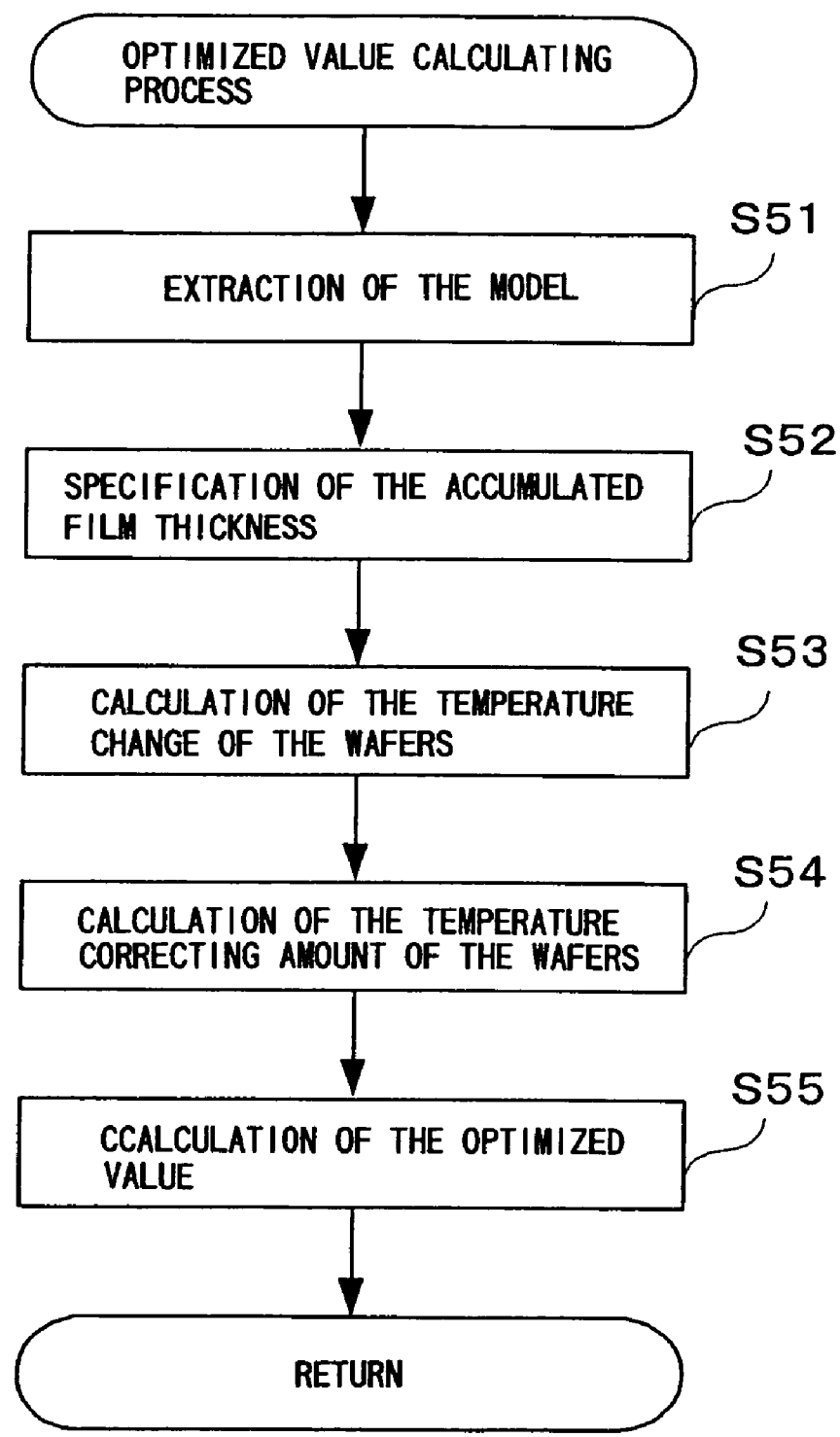
FIG. 15 is a flow chart for illustrating the optimized value calculating process.

Next, the heating method employing the heating system 1 of this embodiment constructed as described above will be discussed. It should be noted that since this method is the same as the heating method described in the first embodiment, except for the optimized value calculating process performed by the control unit 44 of the temperature calculating computer 4, only the optimized value calculating process performed by the control unit 44 will be described below. FIG. 15 is a flow chart for illustrating the optimized value calculating process.

First, the control unit 44 extracts the model stored in the model storage unit 45, based on the transmitted information concerning the heating apparatus 2 as well as on the kind of the process in the received information (step S51). Then, the control unit 44 specifies the accumulated film thickness from the received information (step S52). Subsequently, the control unit 44 calculates the temperature change of the wafers based on the extracted model and the specified accumulated film thickness (step S53). Thereafter, the control unit 44 calculates the temperature correcting amount for the wafers from the calculated temperature change of the wafers (step S54).

Thereafter, the control unit 44 calculates the optimized value of each zone such that the temperature of the semiconductor wafers W contained in the heating apparatus 2 will be changed by the calculated temperature correcting amount (step S55). Specifically, the control unit 44 calculates the preset temperature of each heater 191 to 195 of the heating apparatus 2, i.e., the optimized value of each zone, by using the information concerning the relationship between the temperature change of each heater 191 to 195 stored in the temperature model information storage unit 47 and the temperature change of the semiconductor wafers W contained in each zone, and then stops this process.

Figure 16A:
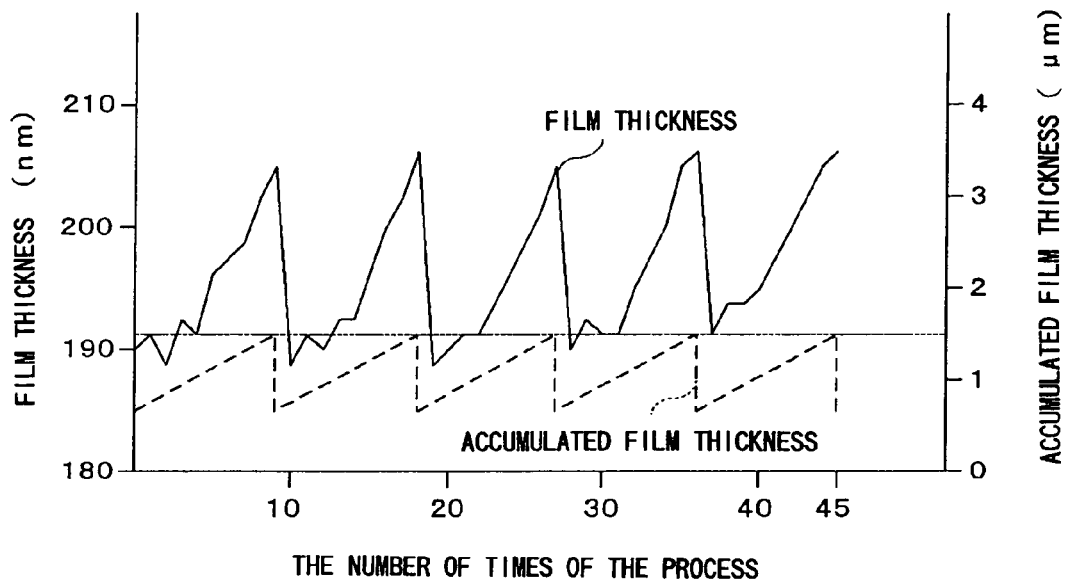
FIGS. 16A and 16B are graphs respectively showing a relationship between the number of times of the process, a film thickness and an accumulated film thickness.
Figure 16B:
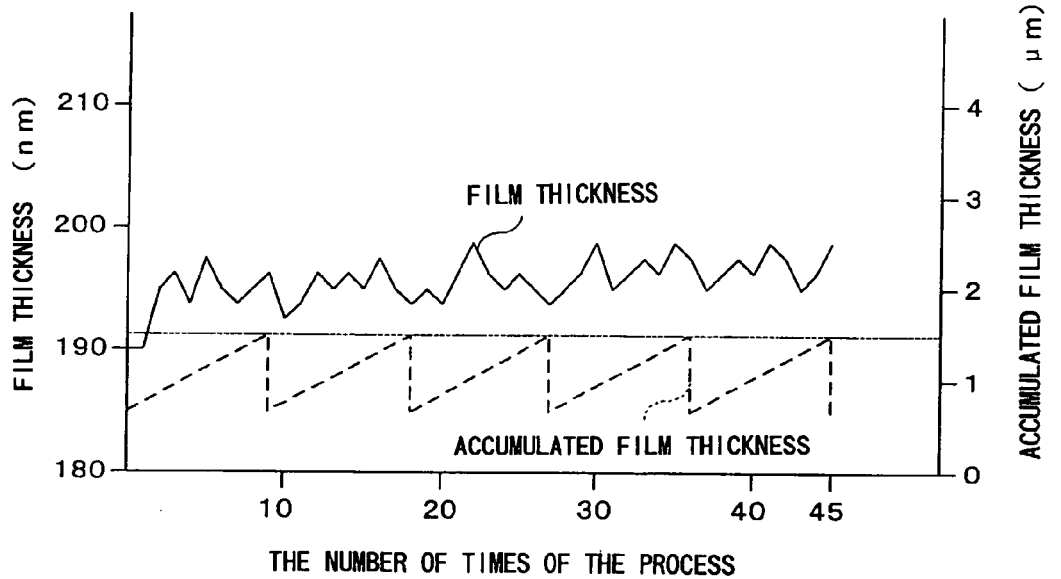

FIG. 16B shows a relationship between the number of times of the heating process, the film thickness of the formed film and the accumulated film thickness, in order to check the effect obtained by the case in which the heating method of this embodiment is employed. For comparison, the case, in which the heating method of this embodiment is not employed, is shown in FIG. 16B. It is noted that both in FIGS. 16A and 16B, the heating apparatus 2 is cleaned at each point of time that the accumulated film thickness reaches 1.5 μm.

As shown in FIGS. 16A, 16B, it is found that variation of the film thickness measured for each semiconductor wafer W can be lessened by using the heating method of this embodiment.

As stated above, according to this embodiment, since the optimized value of each zone is calculated by using the model and accumulated film thickness stored in the model storage unit 45 and the heating process is then performed based on the calculated optimized value, a more appropriate heating process can be provided. Additionally, even by the operator having no information and/or experience about the heating system and/or process, the heating temperature can be readily controlled.

It should be appreciated that the present invention is not limited to the embodiments described above, and various modifications and applications can be made thereto. Hereinafter, other embodiments applicable to this invention will be discussed.

In the above embodiments, this invention has been described, by way of example, in regard to the case in which the host computer 3 and the temperature calculating computer 4 are connected with the plurality of the heating apparatus 2 via the networks 5, 6. However, the host computer 3 may store therein the device DB 42 that has been stored in the temperature calculating computer 4 such that the host computer 3 can perform the processes that have been performed by the temperature calculating computer 4.

Additionally, in the embodiments discussed above, this invention has been described, by way of example, with respect to the case in which the recipe used for the heating process is designed to perform the optimized value calculating process upon being used as the optimized value calculating recipe. For instance, however, the optimized value calculating process may be performed when the accumulated film thickness becomes greater than a predetermined thickness. Alternatively, the optimized value calculating process may always be performed.

In the first embodiment of the above embodiments, this invention has been described, by way of example, with respect to the case in which the temperature correcting table, indicative of the relationship between the processing temperature, the accumulated film thickness and the temperature correcting amount, is used. The temperature correcting table may also be adapted for changing other processing conditions.

In the second embodiment of the above embodiments, this invention has been described, by way of example, with regard to the case in which the model is prepared by using the least squares method. This invention, however, is not limited to this aspect. For example, the model may be prepared in a LOOKUP table mode, by using the spacing interpolation.

Additionally, in the second embodiment of the above embodiments, this invention has been described, by way of example, with respect to the case in which the optimized value of each zone is calculated based on the information stored in the temperature model information storage unit 47. Furthermore, the range of temperature control may be properly limited as well as the conditions for limiting the optimization, such as by setting a zone that is preferentially changed, may be fixed, so that the optimized value of each zone can be calculated under such conditions.

In the embodiments discussed above, this invention has been described, by way of example, in regard to the case in which the optimized value of each zone is calculated, and the temperature is then controlled based on the calculated optimized value. However, the temperature control may be performed in combination with further various controlling methods.

Additionally, in the embodiment discussed above, this invention has been described by way of example, in regard to the case of the batch type heating apparatus having a single vessel structure. However, for example, the present invention may also be applied to the batch type heating apparatus having a double vessel structure, in which the reaction vessel 11 is composed of an inner vessel and an outer vessel. Furthermore, this invention may also be applied to a sheet-feeding type heating apparatus.

It should be noted that the number of the stages of the heaters (or number of the zones), the number of monitoring wafers extracted from each zone, and the like, can be set optionally. In addition, it is also contemplated that the interior of the apparatus may not be divided into the plurality of zones.

The present invention is not limited to the process for the semiconductor wafers, but it may also be applied to, for example, a process for semiconductor substrates, PDP substrates and the like.

The control unit 44 related to the above embodiments of this invention can be achieved by using a usual computer system without employing any special system for exclusive use. For example, the control unit 44 or the like for performing the aforementioned process can be constructed, for example, by installing programs for executing the heating method as described above, from a storage medium (i.e., a flexible disk, a CD-ROM or the like) storing them therein, into a general purpose computer.

A means for providing these programs can be optionally selected. Namely, rather than providing them via the predetermined storage medium as described above, they may be provided via other media, for example, communication lines, communication networks, communication systems and the like. In such a case, for example, these programs may be put up on a bulletin board system (BBS) of the communication network, and then provided via the network while being superimposed into a carrier wave. Thereafter, the process described above can be performed, by starting the programs provided as described above and executing them in the same manner as the other application programs, under control of an OS.

The invention claimed is:

1. A heating system, comprising:
   a heating means having a processing chamber adapted for containing an object to be processed therein, the heating means being adapted for heating the object to be processed in the processing chamber;
   a heating condition storage means adapted for storing therein heating conditions including heating temperature in the processing chamber, corresponding to details of a heating process provided to the object to be processed;
   a heating control means adapted for controlling the heating means for heating the object to be processed in the processing chamber in accordance with the heating conditions stored in the heating condition storage means;
   a heating process number of times storage means adapted for storing therein the number of times of the heating process due to the heating means;
   a temperature correcting table storage means adapted for storing therein a temperature correcting table indicative of a relationship between the heating temperature, an accumulated film thickness of extraneous matter associated with the heating process and attached to the interior of the apparatus, and a temperature correcting value for correcting a temperature error in the processing chamber attributable to the attachment of the extraneous matter; and
   an optimized value calculating means adapted for specifying a current accumulated film thickness of the extraneous matter based on the heating process number of times storage means when the heating means heats the object to be processed in accordance with the heating conditions, as well as adapted for calculating an optimized value of the temperature in the processing chamber based on the specified accumulated film thickness, the heating temperature stored in the heating condition storage means, and the temperature correcting table stored in the temperature correcting table storage means,
   wherein the heating control means is configured to change the heating temperature stored in the heating condition storage means into the optimized value calculated by the optimized value calculating means, so as to heat the object to be processed at the changed heating temperature.

2. The heating system according to claim 1, wherein the heating control means updates the heating temperature stored in the heating condition storage means by the optimized value.

3. The heating system according to claim 1, wherein the processing chamber can be divided into a plurality of zones, and the heating condition storage means stores therein the heating temperature for each zone.

4. The heating system according to claim 1, wherein the heating condition storage means stores therein the heating conditions in which calculation of the optimized value due to the optimized value calculating means is designated, and wherein the optimized value calculating means calculates the optimized value when the heating means heats the object to be processed in accordance with the heating conditions in which the calculation of the optimized value is designated.

5. The heating system according to claim 1, wherein the optimized value calculating means calculates the optimized value when the accumulated film thickness is greater than a predetermined thickness.

6. The heating system according to claim 1, wherein a plurality of heating apparatuses are provided in the system, and the optimized value calculating means is connected with the plurality of heating apparatuses via a communication means, and wherein the optimized value calculating means transmits the calculated optimized value to each corresponding heating apparatus via the communication means.

7. A heating system, comprising:
a heating means having a processing chamber adapted for containing an object to be processed therein, the heating means being adapted for heating the object to be processed in the processing chamber;
a heating condition storage means adapted for storing therein heating conditions including heating temperature in the processing chamber, corresponding to details of a heating process provided to the object to be processed;
a heating control means adapted for controlling the heating means for heating the object to be processed in the processing chamber in accordance with the heating conditions stored in the heating condition storage means;
a heating process number of times storage means adapted for storing therein the number of times of the heating process due to the heating means;
a model storage means adapted for storing therein a model indicative of a relationship between an accumulated film thickness of extraneous matter associated with the heating process and attached to the interior of the apparatus and a temperature change of the object to be processed; and
an optimized value calculating means adapted for specifying a current accumulated film thickness of the extraneous matter based on the heating process number of times storage means when the heating means heats the object to be processed in accordance with the heating conditions, as well as adapted for calculating an optimized value of the temperature in the processing chamber based on the specified accumulated film thickness and the model stored in the model storage means,
wherein the heating control means is configured to change the heating temperature stored in the heating condition storage means into the optimized value calculated by the optimized value calculating means, so as to heat the object to be processed at the changed heating temperature.

8. The heating system according to claim 7, wherein the model is prepared for each heating condition corresponding to the details of the heating process provided to the object to be processed, and is stored in the model storage means.

9. The heating system according to claim 7, wherein the model is prepared based on a result of the heating process due to the heating means, with the extraneous matter of the accumulated film thickness being attached to the interior of the apparatus.

10. The heating system according to claim 7, further comprising:
a temperature model information storage means adapted for storing therein temperature model information indicative of a relationship between a plurality of heating units for heating the processing chamber and a temperature of the object to be processed contained in the processing chamber while the processing chamber being heated by the plurality of heating units,
wherein the heating control means is adapted for controlling the heating units, so as to adjust the temperature of the object to be processed in the processing chamber at a temperature corresponding to the optimized value.

11. The heating system according to claim 10,
wherein the processing chamber can be divided into a plurality of zones, and
wherein the plurality of heating units are located corresponding to the respective zones.

12. The heating system according to claim 7, wherein the optimized value calculating means corrects the model stored in the model storage means, after the model is prepared, based on the result of the heating process due to the heating means.

13. A heating method for heating an object to be processed contained in a processing chamber by using a heating means, the method comprising:
a heating condition storing step of storing heating conditions including heating temperature in the processing chamber, corresponding to details of a heating process provided to the object to be processed;
a heating process controlling step of controlling the heating means for heating the object to be processed in the processing chamber in accordance with the heating conditions stored in the heating condition storing step;
a heating process number of times storing step of storing the number of times of the heating process due to the heating means;
a temperature correcting table storing step of storing a temperature correcting table indicative of, a relationship between the heating temperature, an accumulated film thickness of extraneous matter associated with the heating process and attached to the interior of a heating apparatus, and a temperature correcting value for correcting a temperature error in the processing chamber attributable to the attachment of the extraneous matter; and
an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness, the heating temperature stored in the heating condition storing step, and the temperature correcting table stored in the temperature correcting table storing step, wherein in the heating process controlling step, the heating temperature of the heating conditions is changed into the optimized value calculated in the optimized value calculating step, so as to heat the object to be processed at the changed heating temperature.

14. A heating method for heating an object to be processed contained in a processing chamber by using a heating means, the method comprising:

a heating condition storing step of storing heating conditions including heating temperature in the processing chamber, corresponding to details of a heating process provided to the object to be processed;

a heating process controlling step of controlling the heating means for heating the object to be processed in the processing chamber in accordance with the heating conditions stored in the heating condition storing step;

a heating process number of times storing step of storing the number of times of the heating process due to the heating means;

a model storing step of storing a model indicative of a relationship between an accumulated film thickness of extraneous matter associated with the heating process and attached to the interior of a heating apparatus and a temperature change of the object to be processed; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness and the model stored in the model storing step, wherein in the heating process controlling step, the heating temperature of the heating conditions is changed into the optimized value calculated in the optimized value calculating step, so as to heat the object to be processed at the changed heating temperature.

15. A computer program for use in a heating method for heating an object to be processed contained in a processing chamber by using a heating means, the computer program being designed to be operated in a computer, wherein the heating method comprises:

a heating condition storing step of storing heating conditions including heating temperature in the processing chamber, corresponding to details of a heating process provided to the object to be processed;

a heating process controlling step of controlling the heating means for heating the object to be processed in the processing chamber in accordance with the heating conditions stored in the heating condition storing step;

a heating process number of times storing step of storing the number of times of the heating process due to the heating means;

a temperature correcting table storing step of storing a temperature correcting table indicative of a relationship between the heating temperature, an accumulated film thickness of extraneous matter associated with the heating process and attached to the interior of a heating apparatus, and a temperature correcting value for correcting a temperature error in the processing chamber attributable to the attachment of the extraneous matter; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness, the heating temperature stored in the heating condition storing step, and the temperature correcting table stored in the temperature correcting table storing step, wherein in the heating process controlling step, the heating temperature of the heating conditions is changed into the optimized value calculated in the optimized value calculating step, so as to heat the object to be processed at the changed heating temperature.

16. A computer program for use in a heating method for heating an object to be processed contained in a processing chamber by using a heating means, the computer program being designed to be operated in a computer, wherein the heating method comprises:

a heating condition storing step of storing heating conditions including heating temperature in the processing chamber, corresponding to details of a heating process provided to the object to be processed;

a heating process controlling step of controlling the heating means for heating the object to be processed in the processing chamber in accordance with the heating conditions stored in the heating condition storing step;

a heating process number of times storing step of storing the number of times of the heating process due to the heating means;

a model storing step of storing a model indicative of a relationship between an accumulated film thickness of extraneous matter associated with the heating process and attached to the interior of a heating apparatus and a temperature change of the object to be processed; and an optimized value calculating step of specifying a current accumulated film thickness of the extraneous matter based on the number of times of the process stored in the heating process number of times storing step when the object to be processed is heated in accordance with the heating conditions in the heating process, and then calculating an optimized value of the temperature in the processing chamber based on the specified accumulated film thickness and the model stored in the model storing step, wherein in the heating process controlling step, the heating temperature of the heating conditions is changed into the optimized value calculated in the optimized value calculating step, so as to heat the object to be processed at the changed heating temperature.

* * * * *